United States Patent [19]

Schultz

[11] Patent Number: 4,698,655

[45] Date of Patent: Oct. 6, 1987

[54] OVERVOLTAGE AND OVERTEMPERATURE PROTECTION CIRCUIT

[75] Inventor: Warren J. Schultz, Tempe, Ariz.

[73] Assignee: Motorola, Inc., Schaumburg, Ill.

[21] Appl. No.: 825,954

[22] Filed: Feb. 4, 1986

Related U.S. Application Data

[63] Continuation of Ser. No. 535,180, Sep. 23, 1983, abandoned.

[51] Int. Cl.$^4$ ............................................. H01L 29/78
[52] U.S. Cl. ..................................... 357/23.4; 357/28; 357/38; 357/43; 361/101; 361/103; 307/310
[58] Field of Search ................... 357/23.4, 43, 38, 28; 361/100, 101, 103; 307/310

[56] References Cited

U.S. PATENT DOCUMENTS

| | | | |
|---|---|---|---|
| 3,146,135 | 8/1964 | Sah | 357/38 |
| 3,164,500 | 1/1965 | Benda | 357/38 |
| 3,831,187 | 8/1974 | Nellson | 357/38 |
| 4,298,881 | 11/1987 | Sakurada et al. | 357/38 |
| 4,595,941 | 6/1986 | Avery | 357/38 |

*Primary Examiner*—Joseph E. Clawson, Jr.
*Attorney, Agent, or Firm*—William E. Koch

[57] ABSTRACT

An overvoltage and overtemperature protection circuit that includes an output thyristor fabricated in monolithic integrated circuit form is provided. The thyristor comprises a P-type substrate serving as an anode and diffused cathode and gate region wherein the current flows vertically, optimizing the high voltage and high current capability. A thermal limit circuit is provided for triggering the thyristor when a designated temperature is exceeded. The output thyristor will shunt the output voltage to ground whenever the predetermined voltage or temperature is exceeded.

5 Claims, 6 Drawing Figures

OVERVOLTAGE AND OVERTEMPERATURE PROTECTION CIRCUIT

This application is a continuation, of application Ser. No. 535,180, filed 9/23/83 now abandoned.

BACKGROUND OF THE INVENTION

1. Field of the Invention

This invention relates generally to overvoltage protection circuits and, more particularly, to an overvoltage protection circuit that has a thermal shut-down capability and a vertical power output thyristor fabricated in monolithic integrated circuit form.

2. Background Art

Previously known overvoltage protection circuits have been combined with a discrete thyristor to clamp the output voltage at a predetermined level. Furthermore, previously known overvoltage protection circuits have not included a means for shutting the circuit down when an overtemperature condition is reached.

One previously known voltage regulator, which is similar to an overvoltage protection circuit, is shown in FIG. 1 and includes a differential amplifier for comparing an input voltage with a bandgap reference voltage. A multi-collector PNP transistor has its base connected to the output of the differential amplifier and its emitter connected to a first supply voltage terminal. A first field effect transistor is coupled between a second supply voltage terminal and a first collector of the PNP transistor. A second collector of the PNP transistor is connected to the output voltage. The gate of the first field effect transistor is connected to the gate and source of a second field effect transistor, and is coupled to the first supply voltage terminal by a current source. A thermal limit circuit is coupled between the operational amplifier and the second supply voltage terminal for turning the operational amplifier off when a predetermined temperature is reached. This voltage regulator is described in greater detail in the Detailed Description of the Drawings.

However, the thermal limit circuit of this previously known voltage regulator would turn off a series power transistor instead of shunting the voltage to ground. Furthermore, the previously known overvoltage protection circuits require discrete power output thyristors.

Thus, a need exists for an improved overvoltage protection circuit that includes a power output thyristor fabricated in monolithic integrated circuit form and which further includes a thermal limit circuit for overtemperature protection.

SUMMARY OF THE INVENTION

Accordingly, it is an object of the present invention to provide an improved overvoltage protection circuit.

Another object of the present invention is to provide an overvoltage protection circuit wherein a power output thyristor is included in monolithic integrated circuit form.

A further object of the present invention is to provide an overvoltage protection circuit that will shut down when an overtemperature condition occurs.

In carrying out the above and other objects of the present invention in one form, there is provided an improved thermally triggered overvoltage protection circuit fabricated in monolithic integrated circuit form having a first terminal adapted to receive a first voltage and a second terminal adapted to receive a second voltage. An output thyristor is coupled between the first and second terminals for shunting the first voltage to the second voltage when the first voltage exceeds a predetermined value. A thermal limit circuit is provided that will trigger the thyristor to shunt the voltages when an overtemperature condition is reached.

The above and other objects, features, and advantages of the present invention will be better understood from the following detailed description taken in conjunction with the accompanying drawing.

DETAILED DESCRIPTION OF THE DRAWINGS

Figure 1:
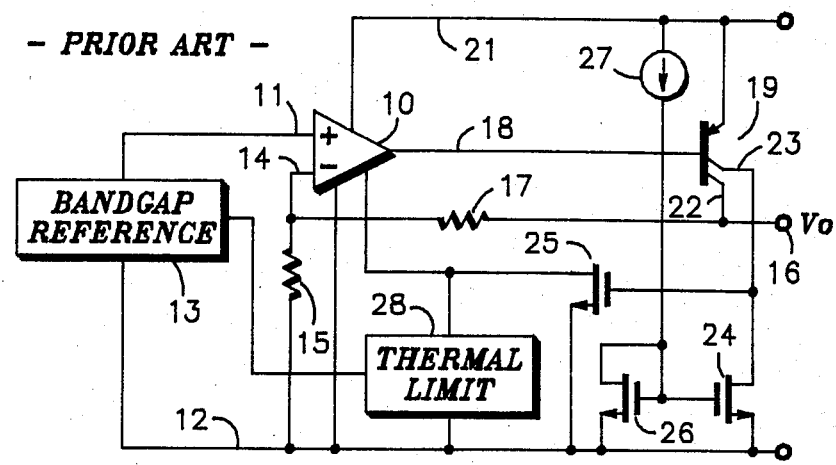
FIG. 1 illustrates in partial block form a prior art voltage regulator.

Referring to FIG. 1, a previously known voltage regulator is shown that includes operational amplifier 10 having non-inverting input terminal 11 coupled to supply voltage terminal 12 by bandgap reference circuit 13 and an inverting terminal 14 coupled to supply voltage terminal 12 by resistor 15 and to output terminal 16 by resistor 17. An output terminal 18 of operational amplifier 10 is connected to the base of multi-collector PNP transistor 19. The emitter of transistor 19 is connected to supply voltage terminal 21. Transistor 19 has collector 22 connected to output terminal 16 and collector 23 connected to the drain of field effect transistor 24 and the gate of field effect transistor 25. The gate of transistor 24 is connected to the gate and drain of field effect transistor 26 and is coupled to supply voltage terminal 21 by current source 27. The sources of field effect transistors 24, 25, 26 are connected to supply voltage terminal 12. Thermal limit circuit 28 is coupled between supply voltage terminal 12 and both operational amplifier 10 and the drain of transistor 25. Thermal limit circuit 28 is further connected to bandgap reference 13 for receiving a bias voltage therefrom. Operational amplifier 10 is further coupled between supply voltage terminals 12, 21 for receiving operating voltages therefrom.

In operation, operational amplifier 10 drives transistor 19 which provides current to output terminal 16 through collector 22. The maximum current through collector 22 is controlled by the current through collector 23 and the mirror circuitry of transistors 24, 26. Feedback from output terminal 16 is provided to inverting terminal 14 through resistor 17, whereby the output voltage is compared with bandgap reference 13. As the voltage at terminal 14 exceeds the voltage of bandgap reference 13, the output of operational amplifier 10 will bias transistor 19 accordingly in order to maintain the voltage at output terminal 16 substantially constant. If the temperature of the voltage regulator of FIG. 1 exceeds a predetermined value, thermal limit circuit 28 will cause operational amplifier 10 to be turned off thereby removing bias to transistor 19.

Figure 2:
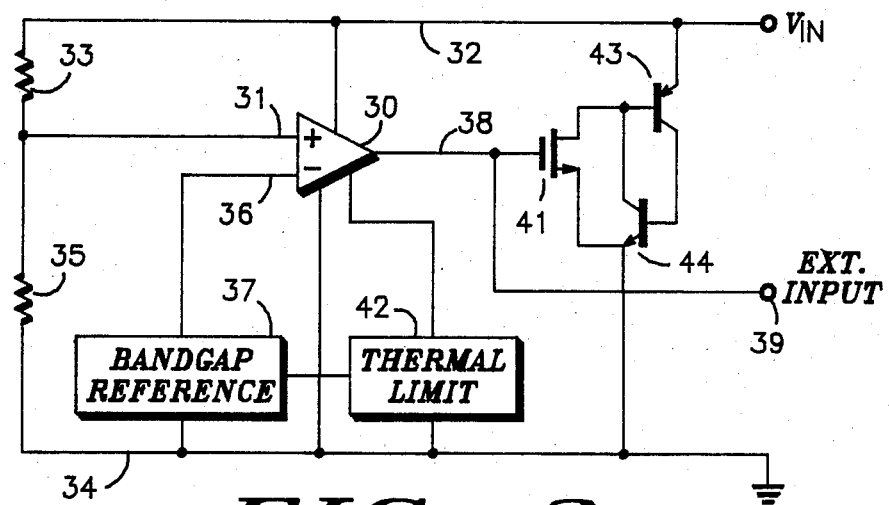
FIG. 2 illustrates in partial block form the preferred embodiment of the present invention.

Referring to FIG. 2, the overvoltage protection circuit of the present invention includes operational amplifier 30 having non-inverting input terminal 31 coupled to voltage terminal 32 by resistor 33 and to voltage terminal 34 by resistor 35. Voltage terminals 32, 34 may be connected to any two wire system in which voltage and thermal limit protection is desired. Resistors 33, 35 serve as a voltage divider for translating the voltage on voltage terminals 32, 34 to non-inverting input terminal 31. Inverting input terminal 36 is coupled to voltage terminal 34 by bandgap reference 37. Operational amplifier 30 is further coupled between voltage terminal 32, 34 for receiving operating voltages therefrom.

Output terminal 38 of operational amplifier 30 is connected to both input terminal 39 and the gate of field effect transistor 41. Thermal limit circuit 42 is coupled between operational amplifier 30 and voltage terminal 34 and causes voltage terminal 32 to shunt to voltage terminal 34 when a predetermined temperature is reached. This function will be discussed in greater detail hereinafter. Thermal limit circuit 42 is also connected to bandgap reference 37 for receiving a bias voltage therefrom.

An output thyristor comprising PNP transistor 43 and NPN transistor 44 is coupled between voltage terminals 32, 34. It is to be understood that the thyristor may be a single PNPN device, but is represented by two transistors for ease of description. The drain of transistor 41 is connected to both the base of transistor 43 and the collector of transistor 44. The source of transistor 41 is connected to both the emitter of transistor 44 and voltage terminal 34. Transistor 43 has its emitter connected to voltage terminal 32 and its collector connected to the base of transistor 44.

In operation, the voltage across voltage terminals 32, 34 is applied to non-inverting input terminal 31 by the voltage divider comprising resistors 33, 35. This voltage at non-inverting input terminal 31 is compared with the voltage at inverting input terminal 36 from bandgap reference 37. When the voltage at non-inverting input terminal 31 is greater than the voltage at inverting input terminal 36, the output from output terminal 38 turns transistor 41 on. The thyristor comprising transistors 43, 44 is triggered and shunts voltage terminal 32 to voltage terminal 34. The thyristor will remain on until the voltage differential across voltage terminals 32, 34 goes to zero. Thermal limit circuit 42 biases operational amplifier 30 similarly, causing transistors 43, 44 to shunt voltage terminal 32 to voltage terminal 34 when a temperature exceeds a predetermined value.

Figure 3:
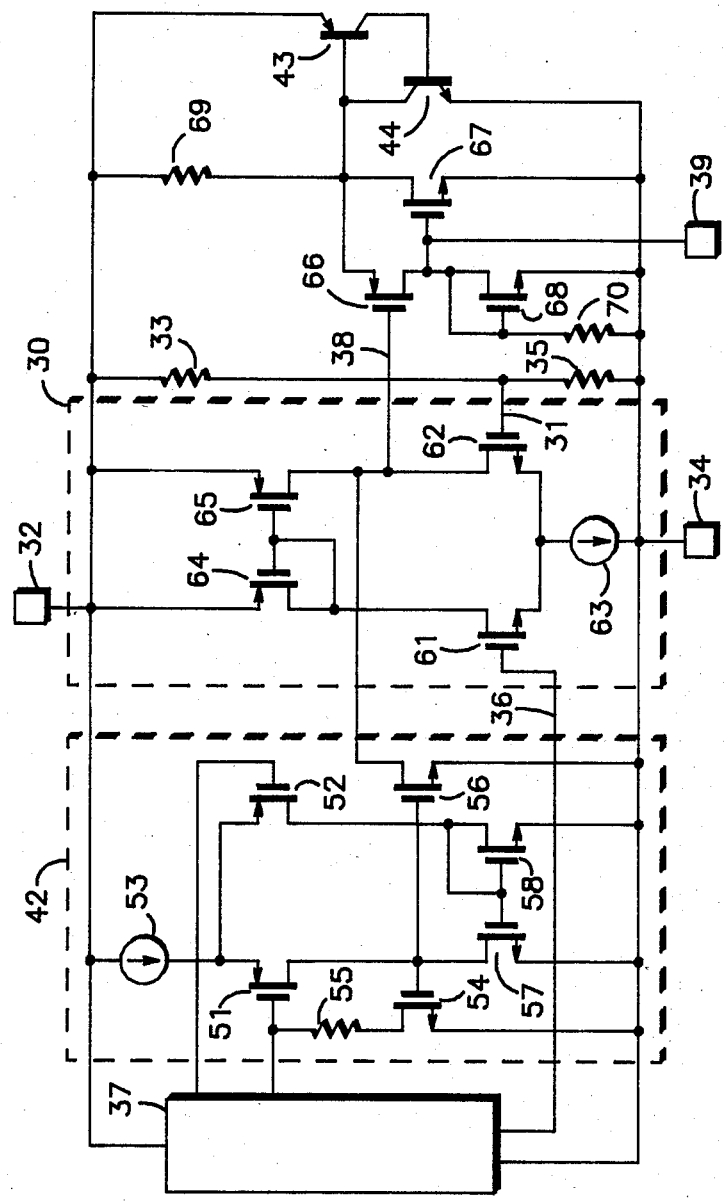
FIG. 3 illustrates in schematic form the preferred embodiment of the present invention.

Referring to FIG. 3, a more detailed combination schematic and block diagram of the invention illustrated in FIG. 2 is shown. Identical devices in FIGS. 2 and 3 bear the same identifying numbers for ease of description. Bandgap reference 37 is shown in block form and comprises typical circuitry for providing reference voltages in a manner known to those skilled in the art. Operational amplifier 30 and thermal limit circuit 42 are illustrated in schematic form and comprise those devices enclosed by the respective dotted blocks. Bandgap reference 37 is coupled between voltage terminals 32, 34 and is connected to the gates of field effect transistors 51, 52 for providing bias voltages thereto. The sources of transistors 51, 52 are coupled to voltage terminal 32 by current source 53. The gate of transistor 51 is also coupled to the drain the field effect transistor 54 by resistor 55. The drain of transistor 51 is connected to the gates of field effect transistors 54, 56 and the drain of field effect transistor 57. The drain of transistor 52 is connected to the gates of field effect transistors 57, 58 and the drain of transistor 58. The sources of transistors 54, 56, 57, 58 are connected to voltage terminal 34. As the temperature increases, bandgap reference 37 provides a voltage at the gate of transistor 52 which increases with respect to the voltage on the gate of transistor 51. When a threshold value of temperature is reached, the resulting differential voltage between the gates of transistor 52 and transistor 51 causes the drain current of transistor 51 to exceed the drain current of transistor 57, thereby causing the gate of transistor 56 to become positively biased. With the gate of transistor 56 positively biased, transistor 56 shunts terminal 38 to its low state, thereby turning on transistor 66. With transistor 66 turned on, the output thyristor consisting of transistor 43 and transistor 44 is triggered, thereby shunting the voltage on terminal 32 to the voltage on terminal 34.

Operational amplifier 30 includes differentially connected field effect transistors 61, 62 which have their sources coupled to voltage terminal 34 by current source 63. The gate of transistor 61 is inverted input terminal 36 and is connected to bandgap reference 37. The gate of transistor 62 is non-inverting input terminal 31 and is coupled to voltage terminal 32 by resistor 33 and to voltage terminal 34 by resistor 35. Resistors 33, 35 function as a voltage divider as previously discussed. The drain of transistor 61 is connected to the gates of field effect transistor 64, 65 and the drain of transistor 64. The drain of transistor 62 is connected to the drains of transistors 56, 65. The sources of transistors 64, 64 are connected to voltage terminal 32.

Output devices include field effect transistors 66, 67, 68 and resistors 69, 70 and are a more complex alternative to the single field effect transistor 41 shown in FIG. 2. Transistor 66 has its gate connected to the drain of transistor 62 and is the equivalent of output terminal 38 of FIG. 2. The source of transistor 66 is coupled to voltage terminal 32 by resistor 69, and is connected to the drain of transistor 67, the base of transistor 43, and the collector of transistor 44. The drain of transistor 66 is connected to input terminal 39, the gate of transistor 67, and both the gate and drain of transistor 68, and is coupled to voltage terminal 39 by resistor 70. The sources of transistors 67, 68 are connected to voltage terminal 34. Transistors 66, 67 amplify the output from operational amplifier 30. Transistor 68 and resistor 70 provide an active pull-down for the gate of transistor 67. The emitters of thyristor transistors 43, 44 are connected to voltage terminals 32, 34, respectively.

In operation, the voltage differential across voltage terminals 32, 34 is translated to non-inverting input terminal 31 by voltage divider resistors 33, 35. As the voltage on non-inverting input terminal 31 increases and exceeds the voltage from bandgap reference 37 supplied to inverting input terminal 36, the differential amplifier switches causing a low voltage to appear on output terminal 38. Therefore, transistor 66 conducts and causes transistor 67 to pull the base of transistor 43 low, thereby triggering the thyristor. Therefore, the thyristor comprising transistors 43, 44 will shunt the voltage on voltage terminal 32 to voltage terminal 34.

If the temperature of the circuit exceeds a predetermined value, thermal limit circuit 42 will cause transistor 56 to conduct and pull output terminal 38 of operational amplifier 30 low and causing the thyristor to shunt the output voltage.

Figure 4:
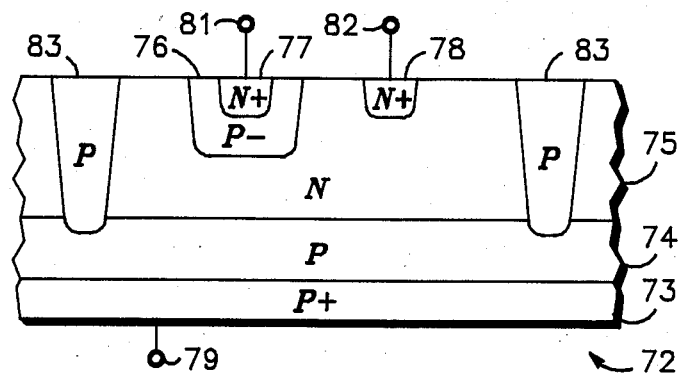
FIG. 4 illustrates in cross-section a bipolar power thyristor in integrated circuit form.

FIG. 4 illustrates in cross-section one embodiment of the structure of the thyristor including transistors 43, 44. Integrated circuit structure 72 illustrates a fully integrated combination of a vertical PNPN power thyristor. A structure is fabricated utilizing a process based on a conventional power transistor process and includes a heavily doped P-type single crystal bulk silicon material 73 serving as a substrate. Overlying bulk material 73 is grown an epitaxial layer 74. The epitaxial layer is P-doped and has a higher resistivity than does the bulk region 73. Epitaxial layer 74 has a thickness and doping to achieve the breakdown voltage characteristics desired for the PNPN thyristor. Epitaxial layer 74 and bulk region 73 form the anode of the thyristor. Overlying the anode is grown an N-type epitaxial layer 75. A lightly doped P-type region 76 is diffused into epitaxial layer 75. An N-type cathode region 77 is diffused into P-type region 76. An N-type gate region 78 may also be diffused into N-type epitaxial layer 75 to facilitate ohmic contact. This is the basic structure of a vertical PNPN power thyristor. The device is termed a vertical thyristor since current flows vertically through the device with an anode contact 79 on one surface of the device and cathode 81 and gate 82 contacts on the opposite side of the device. This device is optimized for high voltage and high current capability. The anode current flowing through the device to anode contact 79 flows through the heavily doped, low resistance bulk region 73. The desired high voltage characteristic is determined in large part by the thickness and doping of the epitaxial layers 74, 75.

The vertical thyristor may be electrically isolated from the remaining chip by diffused isolations 83 which extends through the N-type epitaxial layer 75 and into the underlying anode 73, 74. Alternate isolation techniques, i.e., a groove etched through the thickness of the N-type epitaxial layer 75, may be used.

Figure 5:
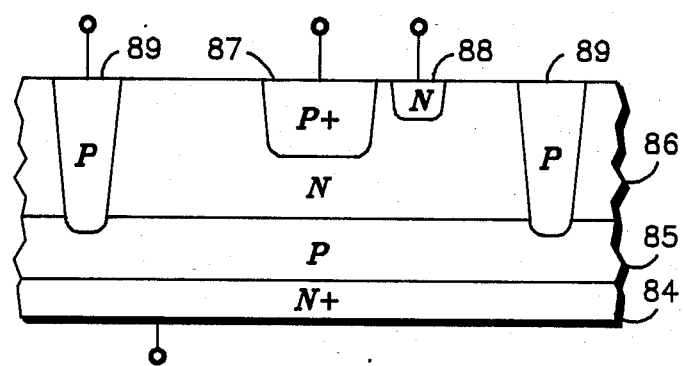
FIG. 5 illustrates in cross-section an alternate structure for a bipolar power thyristor in integrated circuit form.

FIG. 5 illustrates a second embodiment of the power thyristor and includes an N+ substrate 84 serving as a cathode of the thyristor. A P-doped epitaxial layer 85 overlies N+ substrate 84. An N-type epitaxial layer 86 overlies P-doped layer 85. A heavily doped P-type anode region 87 is diffused into N-type epitaxial layer 86. A gate contact diffusion 88 may also be diffused into N-type epitaxial layer 86 to facilitate ohmic contact thereto. Diffused isolations 89 extend through the N-type epitaxial layer 86 and into the underlying P-type epitaxial layer 85. One P-type diffusion 89 can also serve as the gate of the thyristor.

Figure 6:
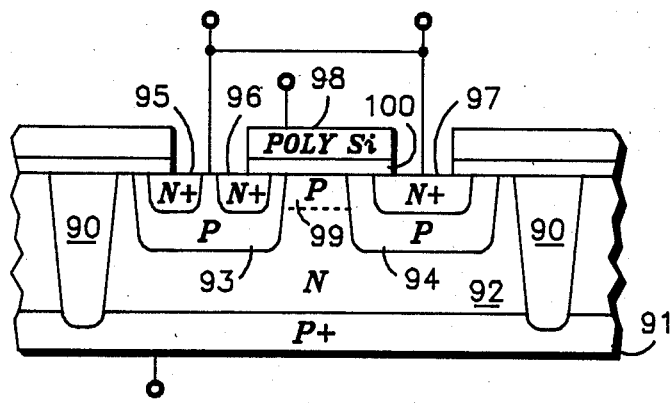
FIG. 6 illustrates in cross-section an MOS Power thyrister in integrated circuit form.

FIG. 6 illustrates in cross section a third embodiment of the thyristor. The MOS structure includes a P+ substrate 91 serving as an anode of the thyristor. An N-type epitaxial layer 92 is grown over the P+ substrate 91 and P-type regions 93, 94 are diffused in N-type epitaxial layer 92. N+ regions 95, 96 are diffused into P region 93 and serve as the source of an MOS transistor. N+ region 97 is diffused into P region 94 and serves as the cathode for the thyristor. A polysilicon layer 98 partially overlies N+ region 96, P regions 93, 94 and N layer 92, and serves as a gate for the MOS transistor. A P-type area 99 is diffused into N-type region 92 for decreasing the resistance in a path between P regions 93, 94. Diffused isolations 90 extend through N layer 92 and into the underlying P+ substrate 91. For clarity, insulating layers, metal layers and the like have not been illustrated. However, it is easily seen that the metal interconnects, i.e., shorts out, N+ regions 95, 96, 97 and P-type region 93. The polysilicon layer 98 is isolated by a surrounding layer 100 of oxide from the metal and regions 92, 93, 94, 96, 97.

The thyristor comprises the vertical structure including N+ region 97, P region 94, N layer 92 and P+ substrate 91. When a positive voltage is placed on P+ substrate 91 (anode) with respect to N+ region 97 (cathode), no current flows due to the reverse biased junction between N layer 92 and P region 94; therefore, the thyristor is in the off state. When an additional positive voltage is placed on polysilicon gate 98 with respect to N+ region 97, a shallow channel of P-type material in region 94 is inverted to N type. A conduction path now exists from P+ substrate 91 across a forward bias junction to N layer 92 through an N-type channel at P region 94 to N+ region 97. Once current begins to flow across the boundary between P+ substrate 91 and N layer 92, regeneration and latching occur in the four-layer structure consisting of P+ substrate 91, N layer 92, P region 94 and N+ region 97 in a manner known to those skilled in the art.

For clarity, insulating layers, metal interconnects, and the like have not been shown in FIGS. 4, 5, 6. These layers and interconnects are formed as in any conventional semiconductor structure. Similarly, the PNPN thyristor has been shown only schematically having simple anode, cathode and gate regions. The structure and practice will be of interdigitated or other geometry to optimize the particular required characteristics.

By now it should be appreciated that there has been provided an improved thermally triggered overvoltage protection circuit. This circuit incorporates a monolithic integrated power thyristor for shunting the output voltage provided thereto. Further, a thermal limit circuit shunts the output voltage when a designated temperature is exceeded.

I claim:

1. An overvoltage protection monolithic semiconductor integrated circuit having a first terminal adapted to receive a first voltage and a second terminal adapted to receive a second voltage, said circuit comprising an output thyristor coupled between said first and second terminals for shunting said first voltage to said second voltage when said first voltage exceeds a predetermined value and a thermal limit circuit coupled to said output thyristor enabling said thyristor to shunt said first voltage to said second voltage when a predetermined temperature is exceeded.

2. The circuit according to claim 1 wherein the structure of said output thyristor comprises:
   a substrate of a first conductivity type forming an anode of said output thyristor;
   a first region having a second conductivity type formed on a surface of said substrate;
   a second region having said first conductivity type formed on a surface of a first portion of said first region;
   a third region having said second conductivity type formed on a surface of a portion of said second region and forming a cathode of said output thyristor; and
   a fourth region having said second conductivity type formed on a surface of a second portion of said first region and forming a gate of said output thyristor.

3. The circuit according to claim 1 wherein the structure of said output thyristor comprises:

a substrate of a first conductivity type forming an cathode of said output thyristor;

a first region having a second conductivity type formed on a surface of said substrate;

a second region having said first conductivity type formed on a surface of said first region;

a third region having said second conductivity type formed on a surface of a portion of said second region and forming an anode of said output thyristor; and a fourth region having said first conductivity type formed on a surface of a second portion of said second region and forming a gate of said output thyristor.

4. The circuit according to claim 1 wherein the structure of said output thyristor comprises:

a substrate of a first conductivity type forming an anode of said output thyristor;

a first region having a second conductivity type formed on a surface of said substrate;

a second region having said first conductivity type formed on a surface of a first portion of said first region;

a third region having said second conductivity type formed on a surface of a portion of said second region and forming a cathode of said output thyristor;

a fourth region having said first conductivity type formed on a surface of a second portion of said first region;

a fifth region having said second conductivity type formed on a surface of said fourth region and forming a source of a MOS transistor;

a polysilicon layer overlying a portion of said first region, said second region, said third region, said fourth region, and said fifth region and forming a gate of said MOS transistor, said MOS transistor for triggering said output thyristor; and an insulating layer formed between said polysilicon layer and said portion of said first, second, third, fourth and fifth regions.

5. An overvoltage protection monolithically integrated circuit having a first terminal adapted to receive a first voltage and a second terminal adapted to receive a second voltage, said circuit comprising:

an output thyristor coupled between said first terminal and said second terminal;

first means for supplying a reference voltage;

second means coupled to said first means and said output thyristor for comparing said reference voltage to said first voltage; and third means coupled to said second means for triggering said output thryistor when a predetermined temperature is exceeded.

* * * * *